United States Patent
Ohki

(10) Patent No.: US 8,003,452 B2
(45) Date of Patent: Aug. 23, 2011

(54) COMPOUND SEMICONDUCTOR DEVICE AND MANUFACTURING METHOD THEREOF

(75) Inventor: Toshihiro Ohki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 86 days.

(21) Appl. No.: 12/639,546

(22) Filed: Dec. 16, 2009

(65) Prior Publication Data

US 2010/0163929 A1      Jul. 1, 2010

(30) Foreign Application Priority Data

Dec. 26, 2008    (JP) .................. 2008-335161

(51) Int. Cl.
*H01L 21/388* (2006.01)
*H01L 29/15* (2006.01)

(52) U.S. Cl. ........ 438/172; 438/167; 438/285; 438/518; 438/590; 438/604; 257/76; 257/E29.081; 257/E21.403

(58) Field of Classification Search ................ 438/172, 438/167, 285, 518, 590, 604
See application file for complete search history.

(56) References Cited

U.S. PATENT DOCUMENTS

| | | | |
|---|---|---|---|
| 6,417,519 B1 * | 7/2002 | Imanishi et al. | 257/11 |
| 6,861,679 B2 * | 3/2005 | Otsuka et al. | 257/194 |
| 2008/0197359 A1 * | 8/2008 | Imanishi et al. | 257/76 |
| 2008/0204140 A1 * | 8/2008 | Kikkawa et al. | 330/277 |

FOREIGN PATENT DOCUMENTS

| | | |
|---|---|---|
| JP | 2002-359256 A | 12/2002 |
| JP | 2006-165207 A | 6/2006 |

* cited by examiner

*Primary Examiner* — Ha Tran T Nguyen
*Assistant Examiner* — Valerie Brown
(74) *Attorney, Agent, or Firm* — Westerman, Hattori, Daniels & Adrian, LLP

(57) ABSTRACT

A compound semiconductor device includes a carrier transit layer formed over a substrate; a carrier supply layer formed over the carrier transit layer; a first metal film and a second metal film formed over the carrier supply layer; a first Al comprising film formed over the first metal film; a second Al comprising film formed over the second metal film; a first Au comprising film formed over the first metal film and is free of direct contact with the first Al comprising film; a second Au comprising film formed over the second metal film and free of direct contact with the second Al comprising film; and a gate electrode that is located over the carrier supply layer between the first metal film and the second metal film.

20 Claims, 20 Drawing Sheets

COMPOUND SEMICONDUCTOR DEVICE AND MANUFACTURING METHOD THEREOF

CROSS-REFERENCE TO RELATED APPLICATIONS

This application is based upon and claims the benefit of priority of the prior Japanese Patent Application No. 2008-335161, filed on Dec. 26, 2008, the entire contents of which are incorporated herein by reference.

FIELD

Aspects of the present invention discussed herein relate to a semiconductor device using a GaN type compound semiconductor and manufacturing method thereof.

BACKGROUND

GaN type high electron mobility transistors (HEMTs) that achieve high power operation, high-speed switching, and high-temperature operation have been drawing attention as field-effect transistors (FETs) that may be used for a portable base station and satellite communication, etc. Various techniques for GaN type HEMT are known.

As a source electrode and a drain electrode for a GaN type HEMT, ohmic electrodes are used. FIG. 1 is a sectional view illustrating a GaN type HEMT structure. As illustrated in FIG. 1, a gate electrode 113g and an ohmic electrode 113o are formed over a compound semiconductor layer 110 constituted of GaN material. The ohmic electrode 113o is constituted of a Ta film 111 that is in contact with the compound semiconductor layer 110, and an Al film 112 formed thereover. A Ti film may be used instead of a Ta film 111. Moreover, a SiN film 106 is formed between the gate electrode 113g and the ohmic electrode 113o. Furthermore, an Au film 114 is provided as a wiring over the ohmic electrode 113o through a barrier metal film 120. The reasons why the Au film 114 is used as a wiring are that the resistance is low, allowable current density is high, and related characteristics. The barrier metal film 120 is provided so that the Al film 112 and the Au film 114 do not contact each other. If the Al film 112 and the Au film 114 contact each other, a corrosion reaction called purple plague progresses and the resistance where the two films contact becomes high, and thereby lowers the reliability. Materials for the barrier metal 120 are Ta, Ti, or W, or nitride of these.

However, suppressing the above described corrosion reaction sufficiently and maintaining high reliability are difficult even when the barrier metal film 120 is utilized. Thickening the barrier metal film 120 may be considered in order to suppress the corrosion reaction; however, this may result in a higher resistance value and larger stresses applied around the barrier metal film 120. Related techniques are discussed in Japanese Laid-open Patent Publication No. 2002-359256, and No. 2006-165207.

SUMMARY

According to an aspect of the invention, a compound semiconductor device includes a carrier transit layer formed over a substrate; a carrier supply layer formed over the carrier transit layer; a first metal film and a second metal film formed over the carrier supply layer; a first Al comprising film formed over the first metal film; a second Al comprising film formed over the second metal film; a first Au comprising film formed over the first metal film and is free of direct contact with the first Al comprising film; a second Au comprising film formed over the second metal film and is free of direct contact with the second Al comprising film; and a gate electrode that is located over the carrier supply layer between the first metal film and the second metal film.

According to an another aspect of the invention, a compound semiconductor device manufacturing method including forming a carrier transit layer over a substrate; forming a carrier supply layer over the carrier transit layer; forming a first metal film and a second metal film over the carrier supply layer; forming a first Al comprising film over the first metal film; forming a second Al comprising film over the second metal film; forming a first Au comprising film over the first metal film and is free of direct contact with the first Al comprising film; forming a second Au comprising film over the second metal film and is free of direct contact with the second Al comprising film; and forming a gate electrode between the first metal film and the second metal film over the carrier supply layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

Figure 1:
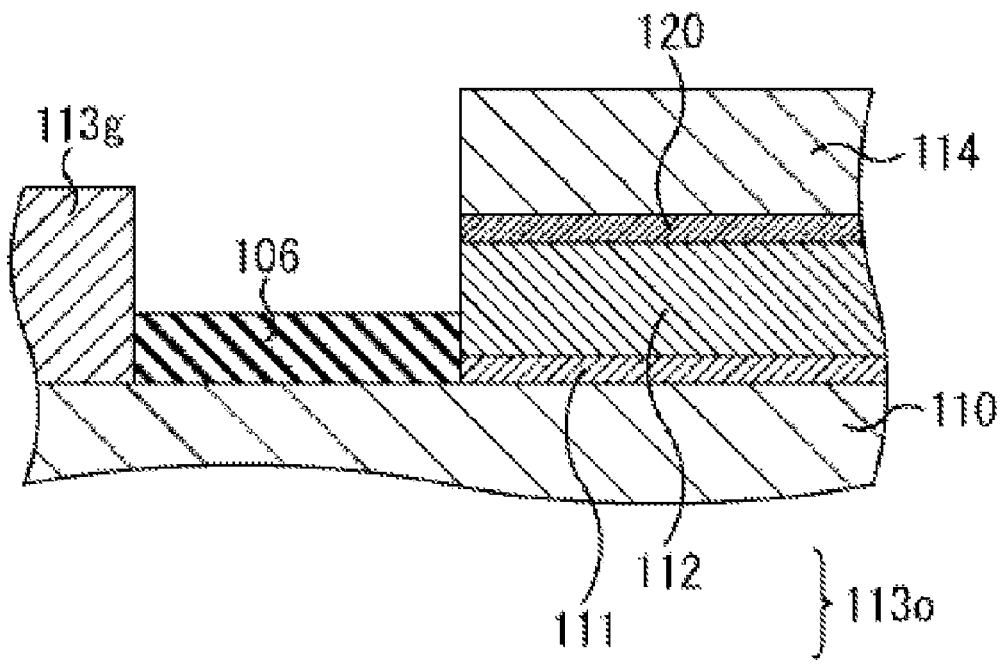
FIG. 1 is a sectional view illustrating a GaN type HEMT structure.
Figure 2:
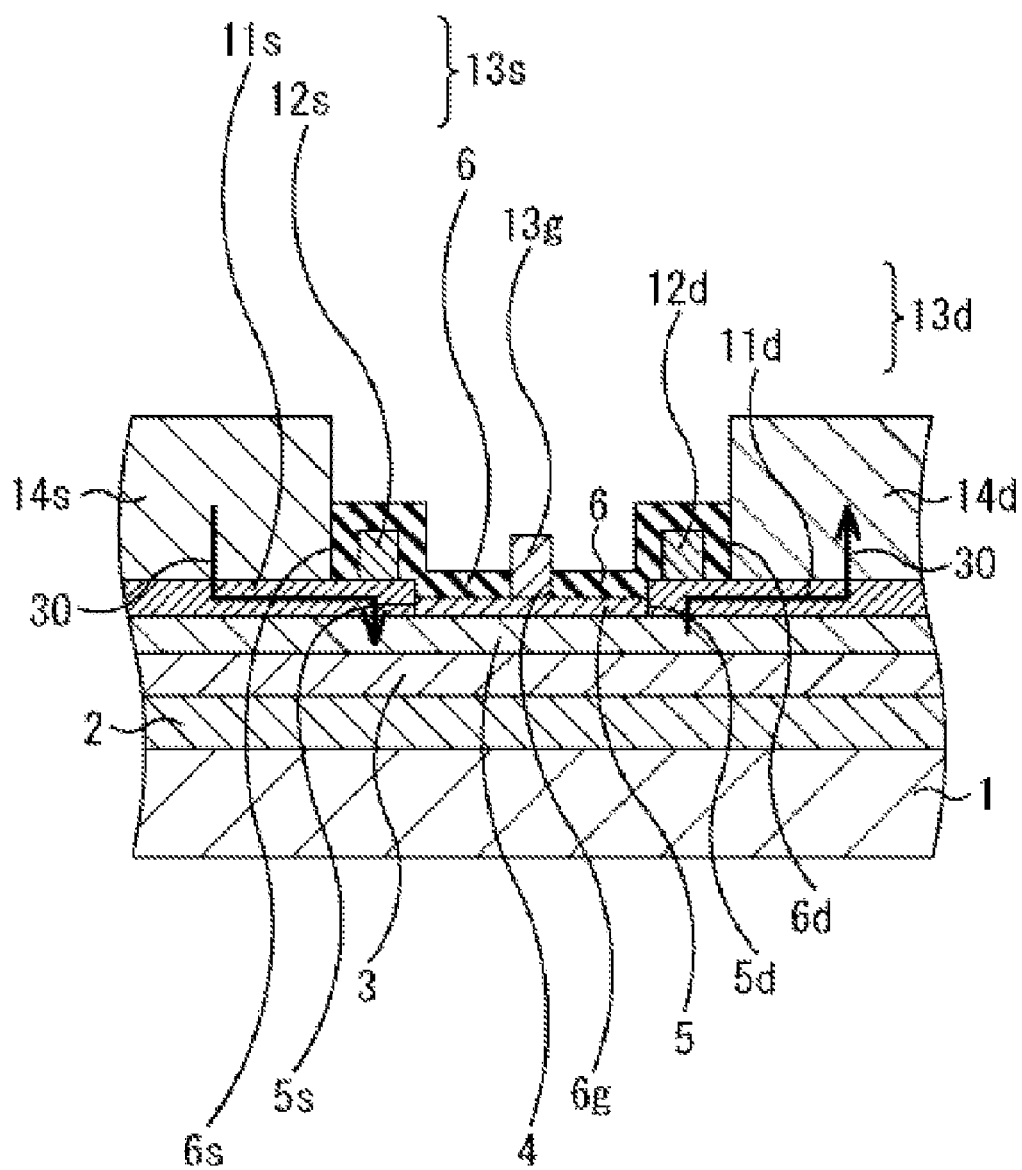
FIG. 2 is a sectional view illustrating a GaN type HEMT structure according to the first embodiment.

A first embodiment will be described. FIG. 2 is a sectional view illustrating a GaN type HEMT (compound semiconductor device) structure according to the first embodiment.

In the first embodiment, a non-doped i-GaN layer 2 (a carrier transit layer) with a thickness of approximately 3 μm is formed over a substrate 1, for example, a SiC substrate. A non-doped i-AlGaN layer 3 with a thickness of approximately 5 nm is formed over the i-GaN layer 2. An n-type AlGaN layer 4 (carrier supply layer) with a thickness of approximately 30 nm is formed over the i-AlGaN layer 3. The n-AlGaN layer 4 is doped with approximately $5 \times 10^{18}$ cm$^{-3}$ of Si. Moreover, an n-type GaN layer 5 (protective layer) with a thickness of approximately 10 nm is formed over the n-AlGaN layer 4. The n-GaN layer 5 is doped with approximately $5 \times 10^{18}$ cm$^{-3}$ of Si. An opening 5s for a source electrode and an opening 5d for a drain electrode are formed in the n-GaN layer 5 and a Ta film 11s is formed in the opening 5s, while a Ta film 11d is formed in the opening 5d. Thicknesses of the Ta film 11s and the Ta film 11d are approximately 3 nm to 100 nm. Then, an Al film 12s is formed over the Ta film 11s and an Al film 12d is formed over the Ta film 11d. According to this embodiment, the Ta film 11s and the Al film 12s are included in the source electrode 13s, and the Ta film 11d and the Al film 12d are included in the drain electrode 13d. Thicknesses of the Al film 12s and 12d are, for example, 50 nm or more, and it is desirable that the thicknesses be 100 nm or more. A dimension (width) of the Al film 12s and the Al film 12d in FIG. 2 is, for example, approximately 2 μm to 3 μm.

A SiN film 6 is formed that covers the n-GaN layer 5, the Ta film 11s, the Al film 12s, the Ta film 11d and the Al film 12d. The thickness of the SiN film 6 is approximately 5 nm to 500 nm, for example, 100 nm. An opening 6g for a gate electrode is formed in the SiN film 6 to expose apart of the n-GaN layer 5. A gate electrode 13g is formed in the opening 6g. The gate electrode 13g is constituted of, for example, a Ni film and an Au film formed thereover. An opening 6s for a source wiring is formed over the SiN film 6 to expose the Ta film 11s, while an opening 6d for a drain wiring is formed over the SiN film 6 to expose the Ta film 11d. The Al film 12s is located in the region between the opening 6s and the gate electrode 13g. The Al film 12d is located in the region between the opening 6d and the gate electrode 13g. An Au film 14s is formed as a source wiring in the opening 6s and an Au film 14d is formed as a drain wiring in the opening 6d. Thicknesses of the Au film 14s and the Au film 14d are approximately 0.1 μm to 50 μm, for example, 5 μm.

According to the first embodiment, a piezoelectric effect is caused by a lattice mismatch in the vicinity of the interface between the i-AlGaN layer 3 and the i-GaN layer 2. Thus, positive polarization charges are generated and electrons are induced in the vicinity of the interface between the i-AlGaN layer 3 and the i-GaN layer 2. As a result, a two-dimensional electron gas layer (2DEG) is generated.

According to this embodiment, the Al film 12s and the Au film 14s, and the Al film 12d and the Au film 14d are spatially separated respectively. Because of this, even if no barrier metal exists between the Al films and the Au films, no corrosion reaction is caused among the Al films and the Au films. The source electrode 13s and the drain electrode 13d are in ohmic contact with the n-AlGaN layer 4 at the lower part of the Al film 12s and 12d. The source electrode 13s and the drain electrode 13d are in ohmic contact with the n-AlGaN layer 4 at the lower part of the Al film 12s and the Al film 12d respectively. Thus, as illustrated in FIG. 2, a current 30 flows through the ohmic contact areas.

A gate leak current from the sides of the gate electrode 13g may be prevented because the SiN film 6 covers the sides of the gate electrode 13g as an insulator layer. Accordingly, sufficient output power and reliability may be achieved, and high breakdown strength may be obtained.

Figure 3:
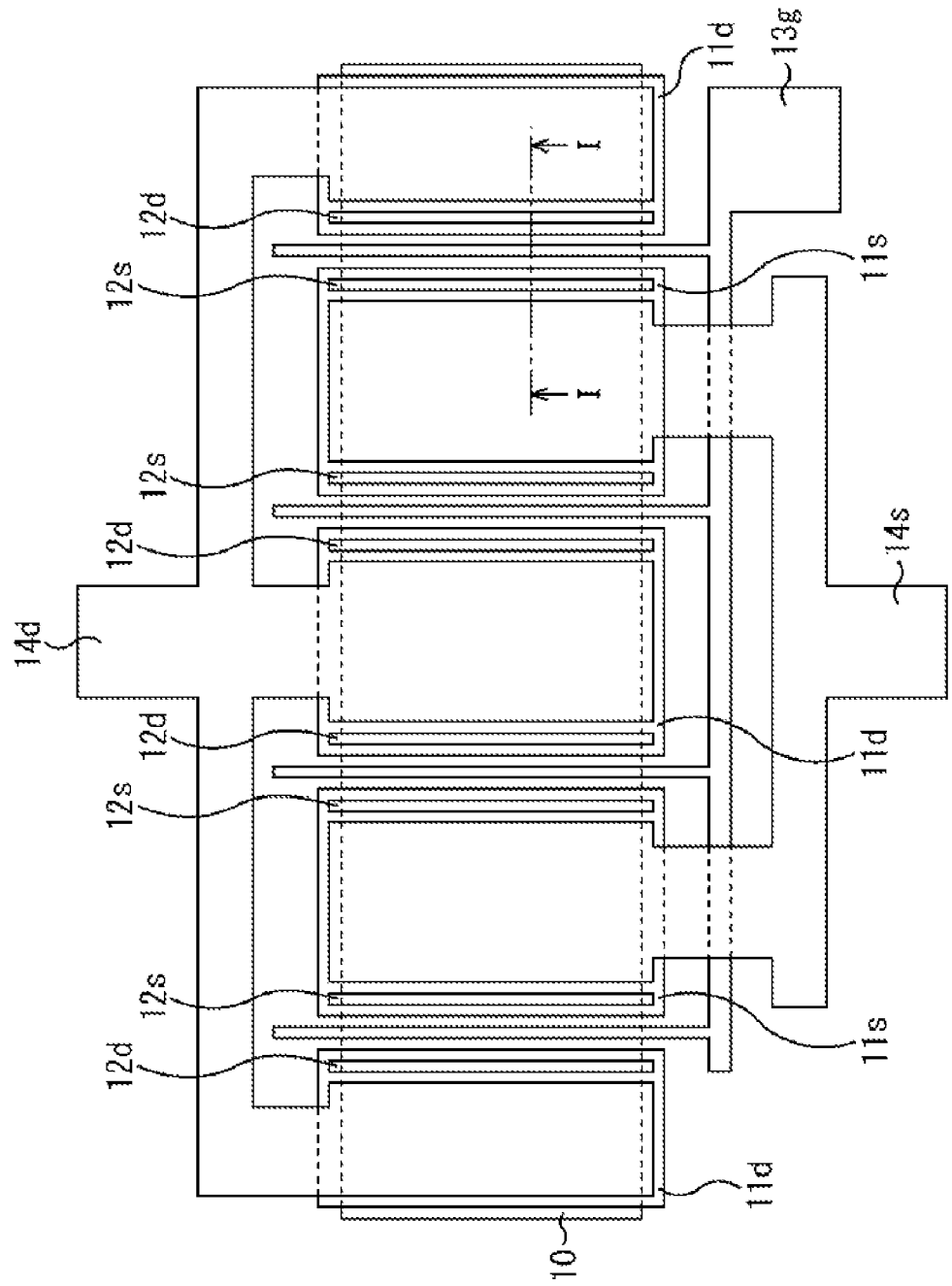
FIG. 3 is a plain view illustrating a GaN type HEMT structure according to the first embodiment.

A layout viewed from the top surface of the substrate 1 may appear, for example, as illustrated in FIG. 3. The planar shape of the gate electrode 13g, the Au film 14s that functions as a source wiring and the Au film 14d that functions as a drain wiring are arranged like a comb, and the comb teeth portions of the Au film 14s and the Au film 14d are alternately arranged. Between the comb teeth portions of the Au film 14s and the Au film 14d, comb teeth portions of the gate electrode 13g are arranged. By employing such a multi-finger gate structure as described above, outputs may be improved. FIG. 2 is a sectional view along the line I-I in FIG. 3. An active region 10 includes an i-GaN layer 2 and an i-AlGaN layer 3 and the peripheral area of the active region 10 is made to be an inactive region by ion implantation or mesa etching etc.

A monolithic microwave integrated circuit (MMIC) may be configured by providing a resistive element and a capacitor and the like together with the above described GaN type HEMT over the substrate 1.

Now, a method for manufacturing a GaN type HEMT (compound semiconductor device) according to the first embodiment will be described. FIGS. 4A to 4G are sectional views illustrating a method for manufacturing a GaN type HEMT according to the first embodiment.

Figure 4A:
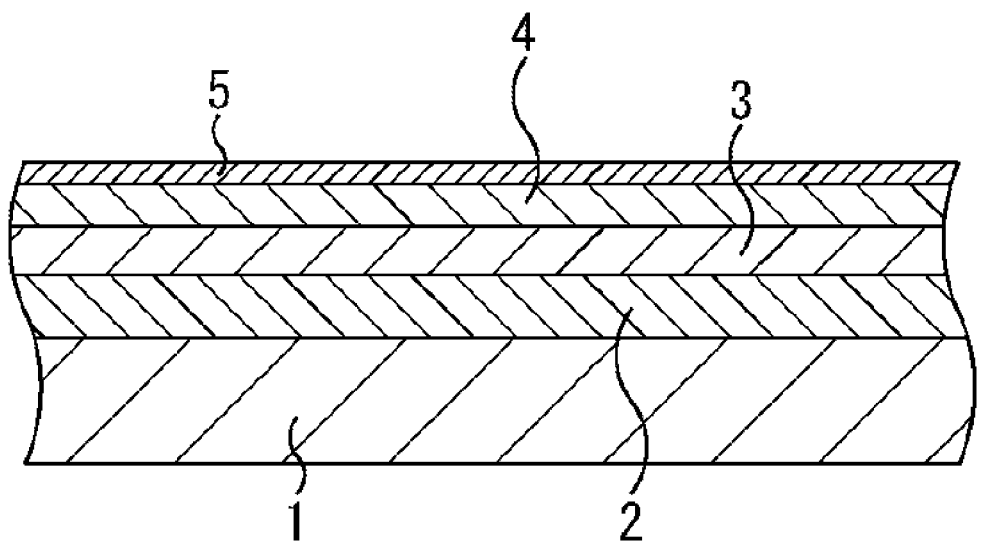
FIGS. 4A to 4G are sectional views illustrating a method for manufacturing a GaN type HEMT according to the first embodiment.

According to the first embodiment, as illustrated in FIG. 4A, the i-GaN layer 2 is formed over the substrate 1. The i-AlGaN layer 3 is formed over the i-GaN layer 2. The n-AlGaN layer 4 is formed over the i-AlGaN layer 3. The n-GaN layer 5 is formed over the n-AlGaN layer 4. The i-GaN layer 2, i-AlGaN layer 3, n-AlGaN layer 4 and n-GaN layer 5 may be formed, for example, by a crystal growth method such as a metal organic vapor phase epitaxy (MOVPE).

Figure 4B:
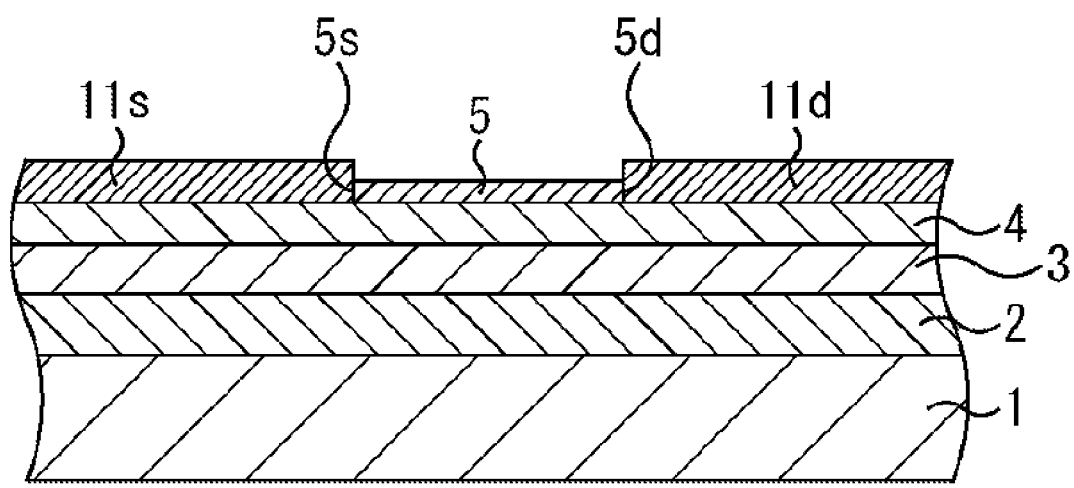

Over the n-GaN layer 5, a resist pattern (not illustrated) is formed to open an area where the Ta film 11s and the Ta film 11d are to be formed. Then, the n-GaN layer 5 is etched using the resist pattern as a mask to form the opening 5S for a source electrode and the opening 5d for a drain electrode as illustrated in FIG. 4B. As an etching method, dry etching using, for example, chlorine-base gas may be employed. As for the depth of the opening 5s and the opening 5d, a part of the n-GaN layer 5 may be kept or a part of the n-AlGaN layer 4 may be removed. In other words, the depths of the opening 5s and the opening 5d may not necessarily match the thickness of the n-GaN layer 5. The Ta film 11s is formed in the opening 5s and the Ta film 11d is formed in the opening 5d respectively by a lift-off method. For forming the Ta film 11s and the Ta film 11d, Ta is deposited, and the Ta deposited on the resist pattern is removed together with the resist pattern.

Figure 4C:
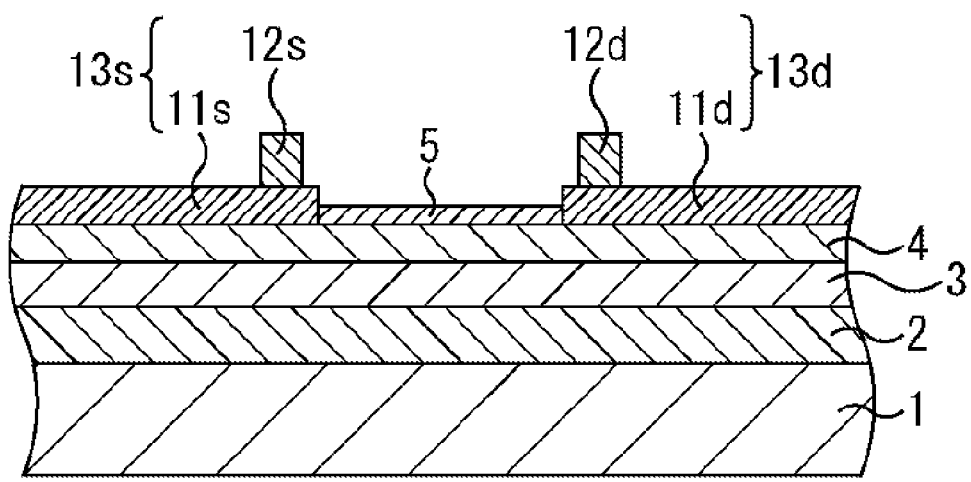

As illustrated in FIG. 4C, the Al film 12s is formed over the Ta film 11s and the Al film 12d is formed over the Ta film 11d respectively by a lift-off method. For forming the Al film 12s and the Al film 12d, for example, a resist pattern (not illustrated) is formed to open an area where the Al film 12s and the Al film 12d are to be formed, Al is deposited, and the Al deposited on the resist pattern is removed together with the resist pattern. After forming the Al film 12s and the Al film 12d, an ohmic property is established by thermal processing in a nitrogen atmosphere 400° C. to 1000° C., for example, at approximately 550° C. In this way, the source electrode 13s and the drain electrode 13d are obtained.

Figure 4D:
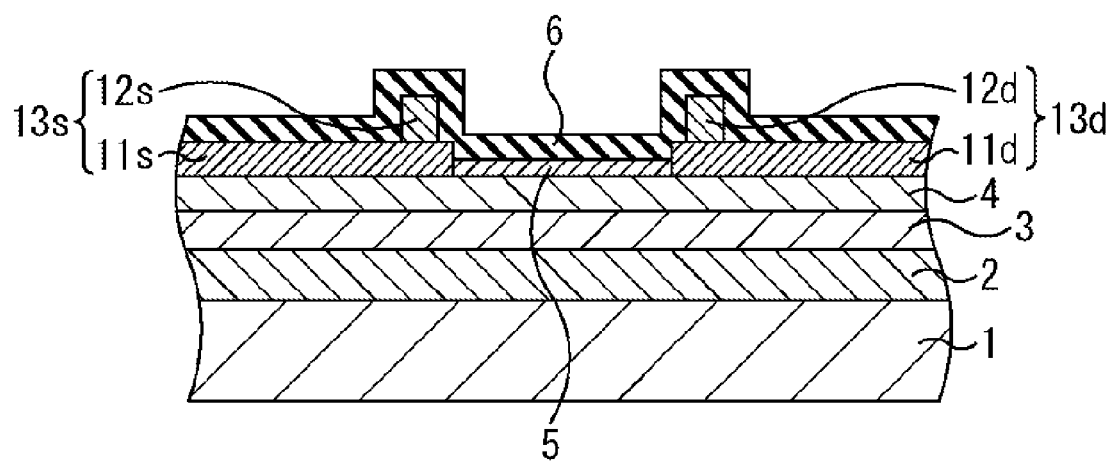

After forming the Al film 12s and the Al film 12d, as illustrated in FIG. 4D, a SiN film 6 is formed. The SiN film 6 is formed, for example, by a plasma CVD method.

Figure 4E:
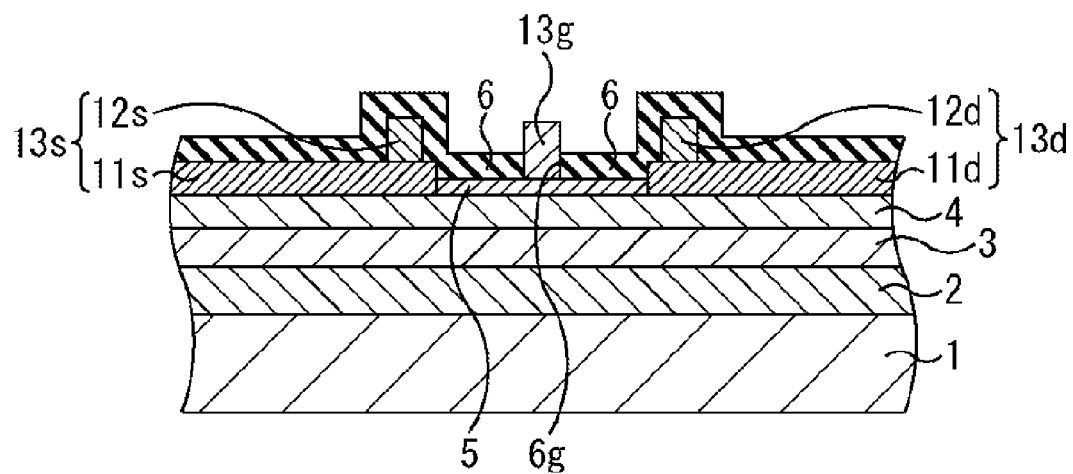

Over the SiN film 6, a resist pattern (not illustrated) is formed to open an area where the gate electrode 13g is to be formed. Then, the SiN film 6 is etched using the resist pattern as a mask to form the opening 6g for a gate electrode as illustrated in FIG. 4E. As for the etching, dry etching using, for example, fluorine-base gas or wet etching using acid is applied. The gate electrode 13g is formed in the opening 6g by a lift-off method. For forming the gate electrode 13g, Ni and Au are deposited, and the Ni and Au deposited on the resist pattern are removed together with the resist pattern.

Figure 4F:
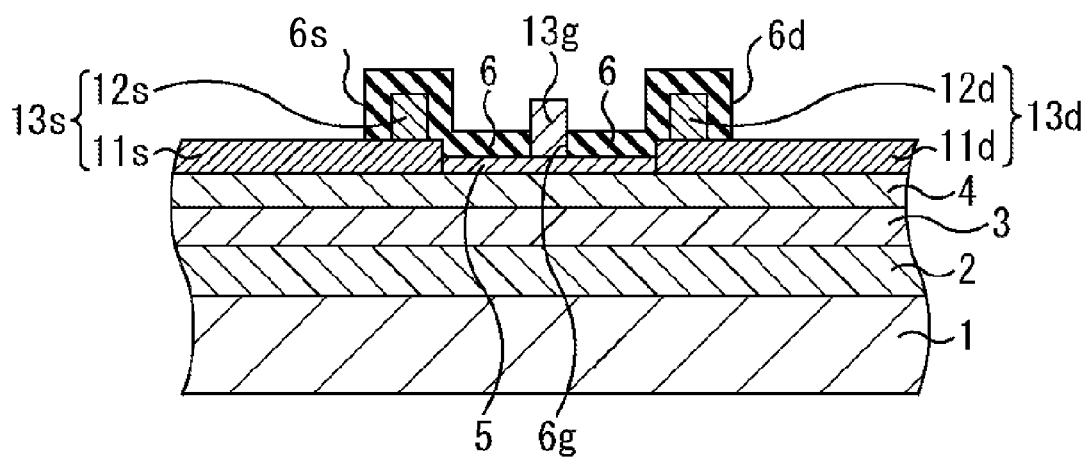

Over the SiN film 6, a resist pattern is formed to open an area where the Au film 14s and the Au film 14d are to be formed (not illustrated). Then, the SiN film 6 is etched using the resist pattern as a mask to form the opening 6s for a source wiring and the opening 6d for a drain wiring as illustrated in FIG. 4F. As for the etching, dry etching using, for example, fluorine-base gas or wet etching using acid is applied. Then, the resist pattern is removed.

Figure 4G:
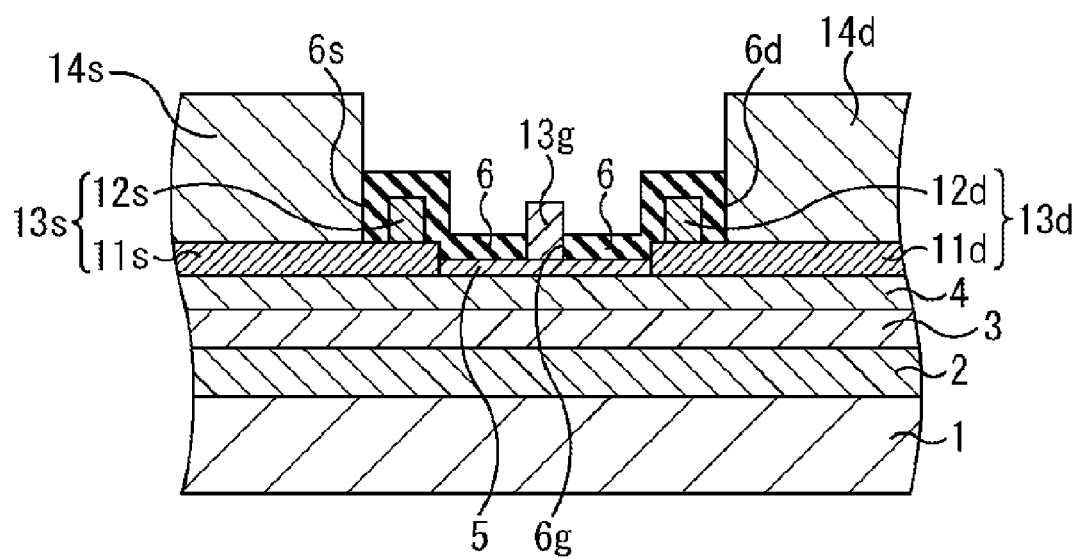

As illustrated in FIG. 4G, the Au film 14s and the Au film 14d are formed in the opening 6s and the opening 6d respectively by a plating method.

This manufacturing method may prevent corrosion reaction between the Au film 14s and the Al film 12s, and the Au film 14d and the Al film 12d as described above.

Second Embodiment

Figure 5:
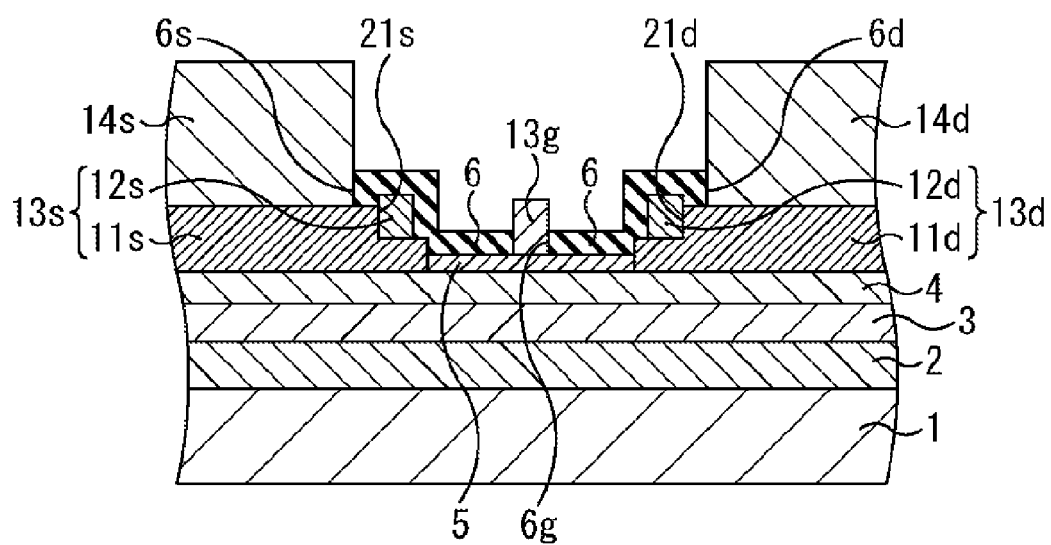
FIG. 5 is a sectional view illustrating a GaN type HEMT structure according to the second embodiment.

Now, a second embodiment will be described. FIG. 5 is a sectional view illustrating a GaN type HEMT (compound semiconductor device) structure according to the second embodiment.

According to the second embodiment, the Ta film 11s is thicker than the Al film 12s and the Ta film 11d is thicker than the Al film 12d at areas that are away from the gate electrode 13g. In other words, a step 21s is formed over the Ta film 11s of the gate electrode 13g side and a step 21d is formed over the Ta film 11d of the gate electrode 13g side respectively. The Al film 12s is disposed along the step 21s and the Al film 12d is disposed along the step 21d respectively. Other configurations are almost the same as those of the first embodiment.

According to this second embodiment, compared with the first embodiment, a contact area between the Ta film 11s and the Al film 12s and that of the Ta film 11d and the Al film 12d are large, thus resistances of the source electrode 13s and the drain electrode 13d become lower.

Now, a method for manufacturing a GaN type HEMT (compound semiconductor device) according to the second embodiment will be described. FIGS. 6A to 6F are sectional views illustrating a method for manufacturing a GaN type HEMT (compound semiconductor device) according to the second embodiment.

Figure 6A:
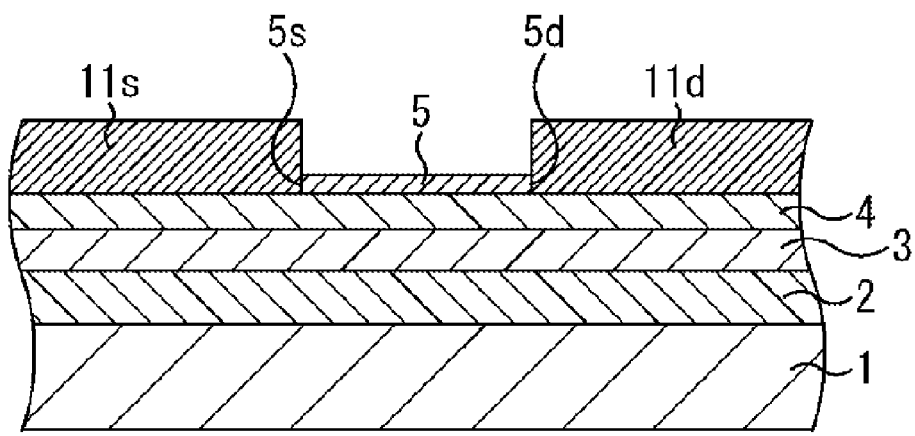
FIGS. 6A to 6F are sectional views illustrating a method for manufacturing a GaN type HEMT according to the second embodiment.

In the second embodiment, processes up to forming an opening 5s and an opening 5d are performed as in the first embodiment. As illustrated in FIG. 6A, the Ta film 11s and the Ta film 11d are formed thicker than those in the first embodiment in the opening 5s and the opening 5d respectively by a lift-off method.

Figure 6B:
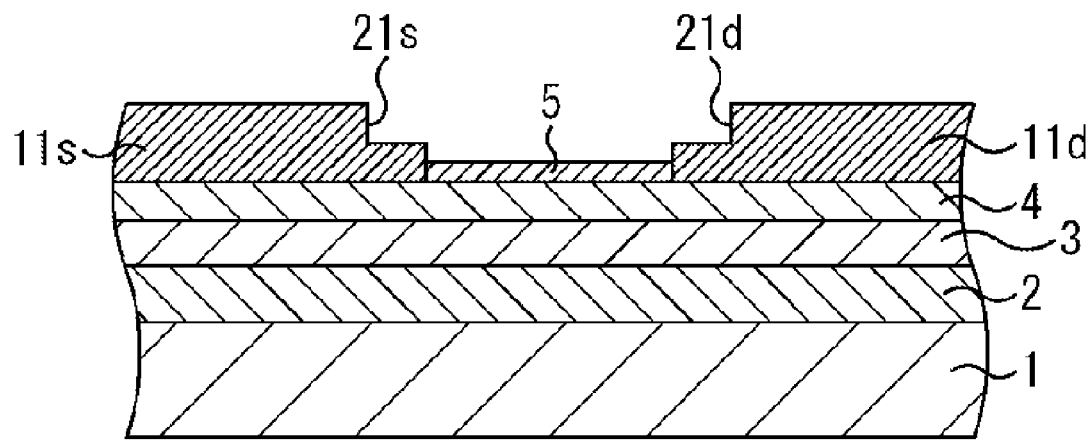

After that, over the Ta film 11s, the Ta film 11d, and the n-GaN layer 5, a resist pattern (not illustrated) is formed to open an area where the step 21s and the step 21d are to be formed. Then, the Ta film 11s and the Ta film 11d are etched to make the Ta film 11s and Ta film 11d thinner using the resist pattern as a mask to form the step 21s and the step 21d over the Ta film 11s and the Ta film 11d respectively as illustrated in FIG. 6B. Thicknesses of the Ta film 11s and the Ta film 11d obtained by thinning them are approximately 3 nm to 10 nm. Then the resist pattern is removed.

Figure 6C:
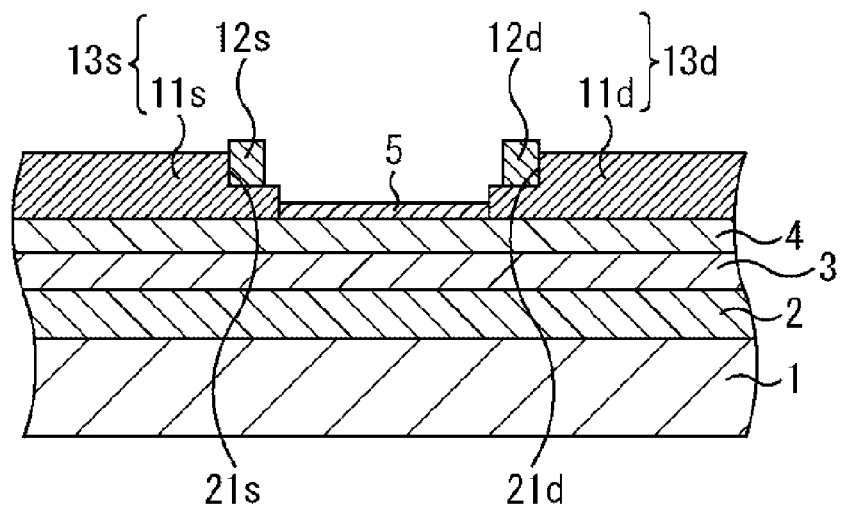

As illustrated in FIG. 6C, the Al film 12s is formed along the step 21s and the Al film 12d is formed along the step 21d respectively by a lift-off method. For forming the Al film 12s and the Al film 12d, a resist pattern (not illustrated) is formed to open an area where the Al film 12s and the Al film 12d are to be formed over the Ta film 11s, the Ta film 11d, and the n-GaN layer 5. Then, Al is deposited, and the Al deposited on the resist pattern is removed together with the resist pattern.

Figure 6D:
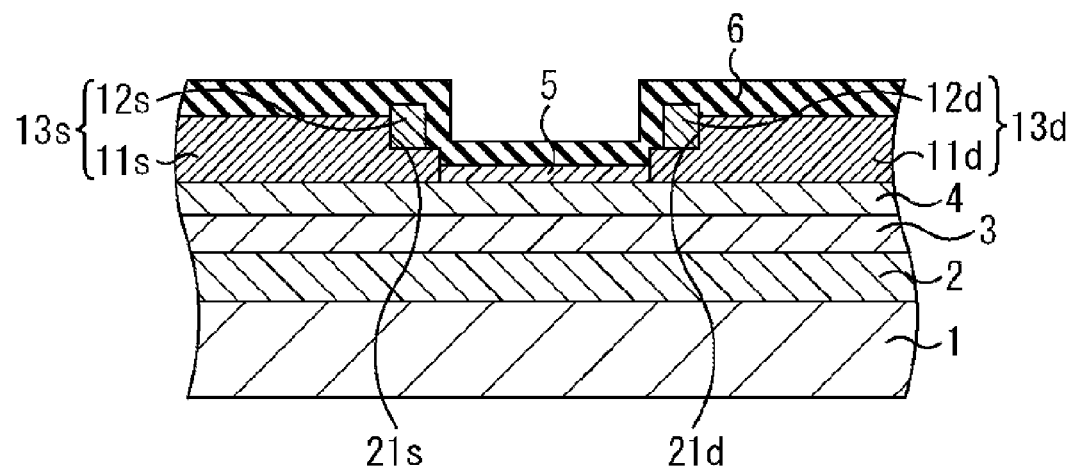

As illustrated in FIG. 6D, the SiN film 6 is formed. The SiN film 6 is formed, for example, by a plasma CVD method.

Figure 6E:
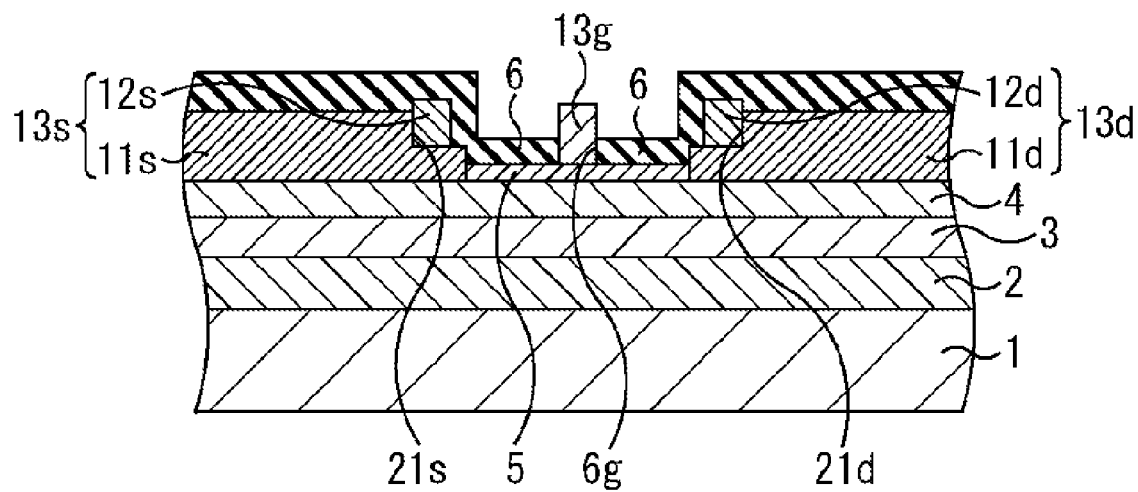

As in the first embodiment, the opening 6g and the gate electrode 13g are formed as illustrated in FIG. 6E.

Figure 6F:
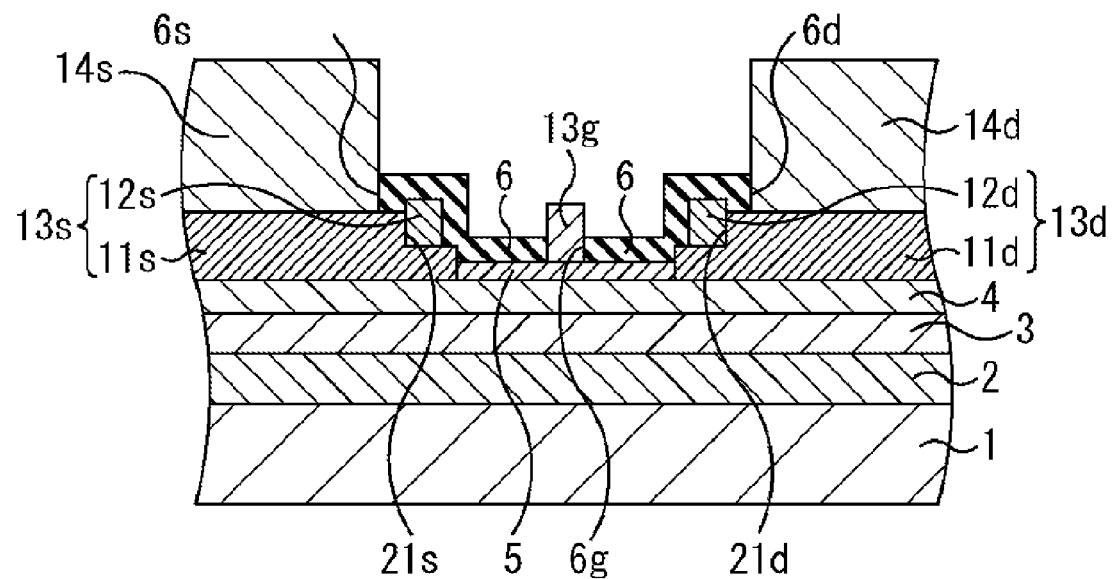

After that, as in the first embodiment, the Au film 14s is formed in the opening 6s and the Au film 14d is formed in the opening 6d respectively as illustrated in FIG. 6F.

In this way, the GaN type HEMT may be manufactured.

Third Embodiment

Figure 7:
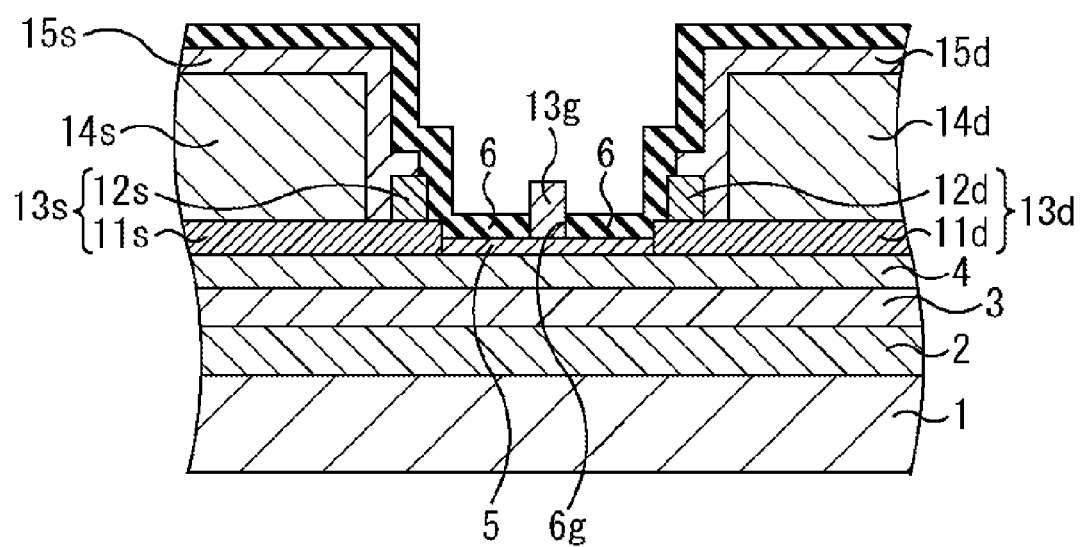
FIG. 7 is a sectional view illustrating a GaN type HEMT structure according to the third embodiment.

Now, a third embodiment will be described. FIG. 7 is a sectional view illustrating a GaN type HEMT (compound semiconductor device) structure according to the third embodiment.

According to the third embodiment, a Ta film 15s is provided that covers an Au film 14s and that is in contact with a Ta film 11s and an Al film 12s, and a Ta film 15d is provided that covers an Au film 14d and that is in contact with a Ta film 11d and an Al film 12d. Moreover, the Au film 14s is covered by a SiN film 6 through the Ta film 15s, and the Au film 14d is covered by the SiN film 6 through the Ta film 15d respectively. Other configurations are the same as those of the first embodiment.

According to the third embodiment, the Au film 14s and the Al film 12s are electrically coupled through the Ta film 15s, and the Au film 14d and the Al film 12d are electrically coupled through the Ta film 15d. Therefore, resistance between the Au films and the Al films are lower compared with those of the first embodiment.

Now, a method for manufacturing a GaN type HEMT (compound semiconductor device) according to the third embodiment will be described. FIGS. 8A to 8D are sectional views illustrating a method for manufacturing a GaN type HEMT (compound semiconductor device) according to the third embodiment.

Figure 8A:
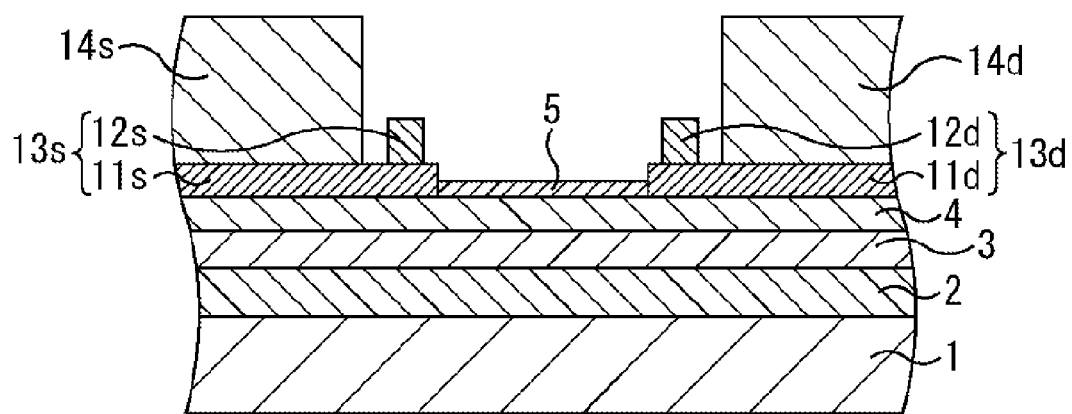
FIGS. 8A to 8D are sectional views illustrating a method for manufacturing a GaN type HEMT according to the third embodiment.

According to the third embodiment, processes up to forming an Al film 12s and an Al film 12d are performed (refer to FIGS. 4A to 4C) as in the first embodiment. As illustrated in FIG. 8A, the Au film 14s is formed over the Al film 12s and the Au film 14d is formed over the Al film 12d respectively by a lift-off method.

Figure 8B:
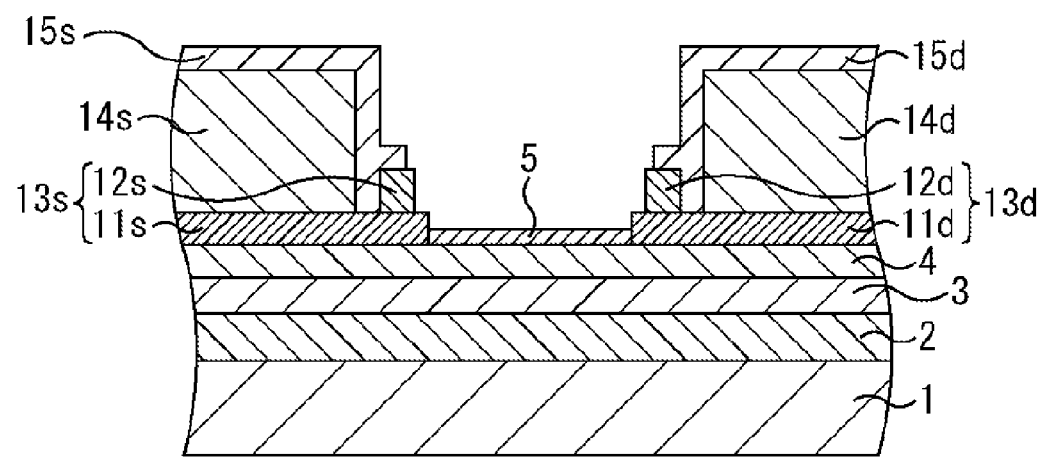

As illustrated in FIG. 8B, a Ta film 15s is formed that covers the Au film 14s and that is in contact with the Ta film 11s and the Al film 12s, and a Ta film 15d is formed that covers the Au film 14d and that is in contact with the Ta film 11d and the Al film 12d. For forming the Ta film 15s and the Ta film 15d, for example, a Ta film is formed over the Au film 14s, the Au film 14d, the Ta film 11s, the Ta film 11d, the Al film 14s, the Al film 14d, and the n-GaN layer 5, by sputtering, and a resist pattern (not illustrated) that covers an area over which the Ta film 15s and the Ta film 15d are to be formed. Using the resist pattern as a mask, the Ta film is etched. As a result, given shapes of the Ta film 15s and the Ta film 15d are obtained.

Figure 8C:
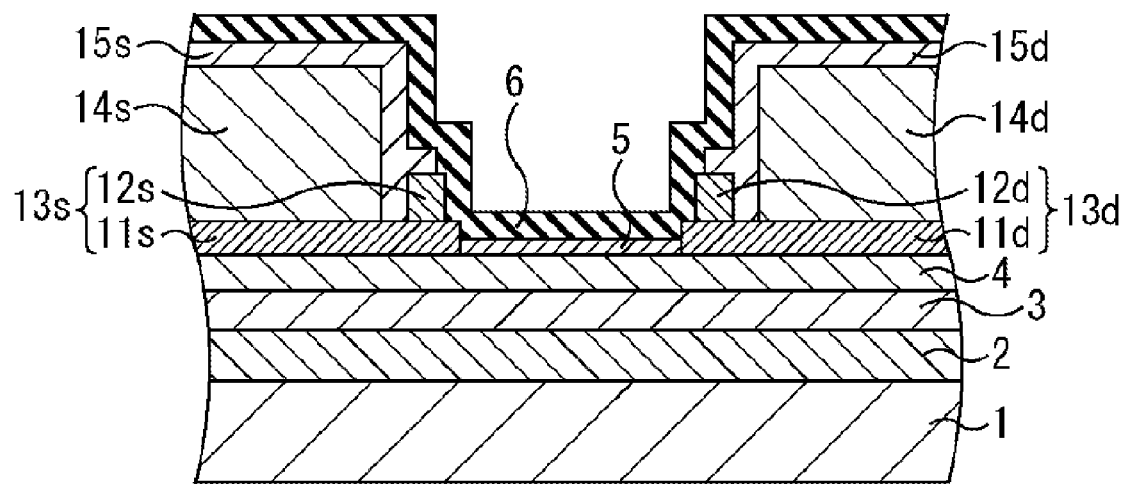

As illustrated in FIG. 8C, the SiN film 6 is formed. The SiN film 6 is formed, for example, by a plasma CVD method.

Figure 8D:
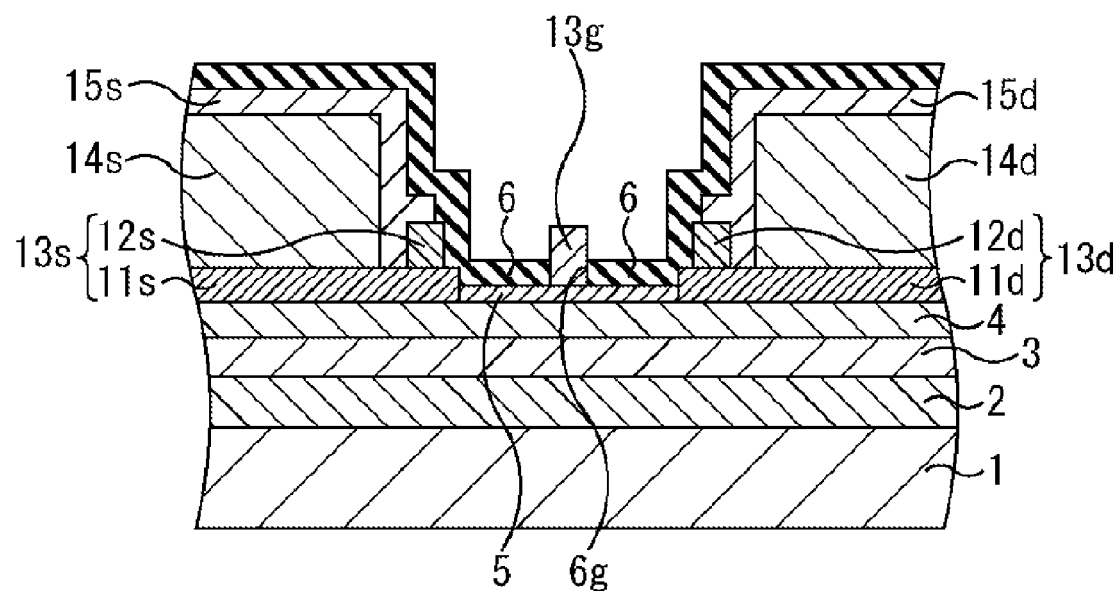

As in the first embodiment, the opening 6g and the gate electrode 13g are formed as illustrated in FIG. 8D.

In this way, the GaN type HEMT may be manufactured.

Fourth Embodiment

Figure 9:
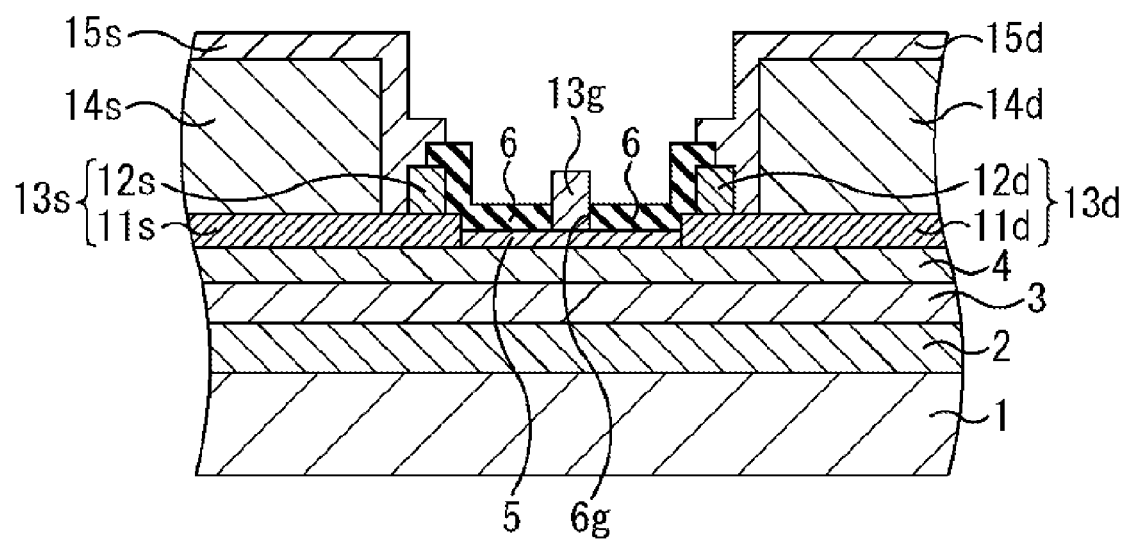
FIG. 9 is a sectional view illustrating a GaN type HEMT structure according to the fourth embodiment.

Now, a fourth embodiment will be described. FIG. 9 is a sectional view illustrating a GaN type HEMT (compound semiconductor device) structure according to the fourth embodiment.

According to the fourth embodiment, over an Al film 12s and an Al film 12d, a SiN film 6 is interposed between a part of a Ta film 15s and an Al film 12s, and between a part of a Ta film 15d and an Al film 12d. The SiN film 6 does not exist over the Ta film 15s and the Ta film 15d. Other configurations are almost the same as those of the third embodiment.

This fourth embodiment may obtain similarly, if not the same effects as, those of the third embodiment.

Now, a method for manufacturing a GaN type HEMT (compound semiconductor device) according to the fourth embodiment will be described. FIGS. 10A to 10D are sectional views illustrating a method for manufacturing a GaN type HEMT (compound semiconductor device) according to the fourth embodiment.

Figure 10A:
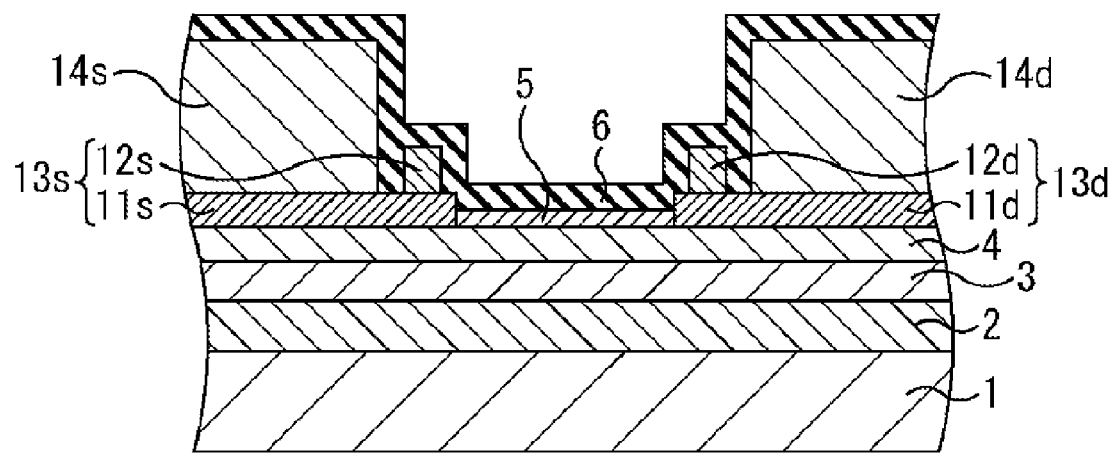
FIGS. 10A to 10D are sectional views illustrating a method for manufacturing a GaN type HEMT according to the fourth embodiment.

According to the fourth embodiment, as in the third embodiment, processes up to forming an Au film 14s and an Au film 14d are performed (refer to FIG. 8A). As illustrated in FIG. 10A, the SiN film 6 is formed. The SiN film 6 is formed, for example, by a plasma CVD method.

Figure 10B:
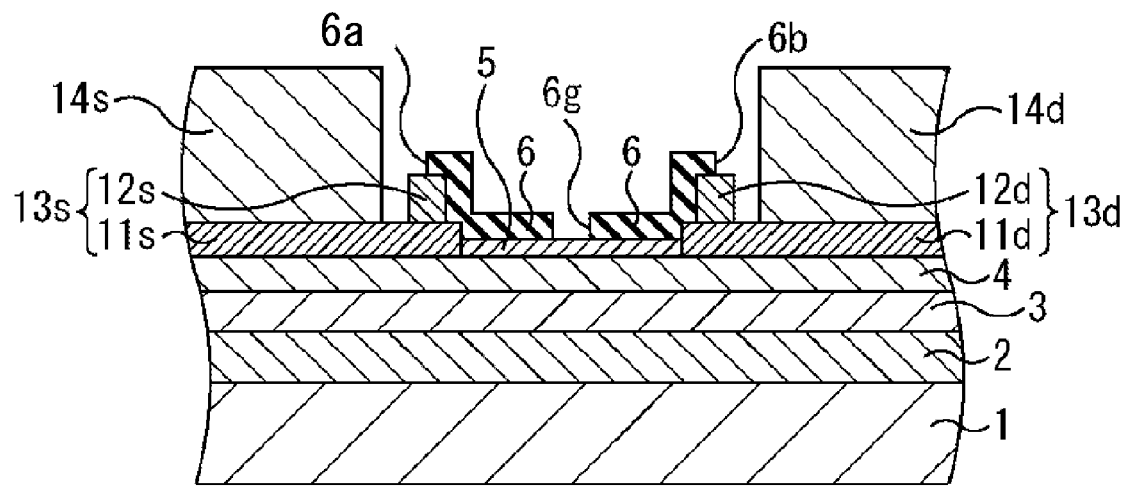

As illustrated in FIG. 10B, an opening 6g, an opening 6a for a source wiring, and an opening 6b for a drain wiring are formed over the SiN film 6. These may be formed simultaneously or individually. The opening 6a is larger than the opening 6s (refer to FIG. 6F) and the opening 6b is larger than the opening 6d (refer to FIG. 6F) respectively. The edge of the opening 6a covers the Al film 12s and the edge of the opening 6b covers the Al film 12d. The Au film 14s is formed over the Ta film 11s and the Au film 14d is formed over the Ta film 11d respectively by a lift-off method.

Figure 10C:
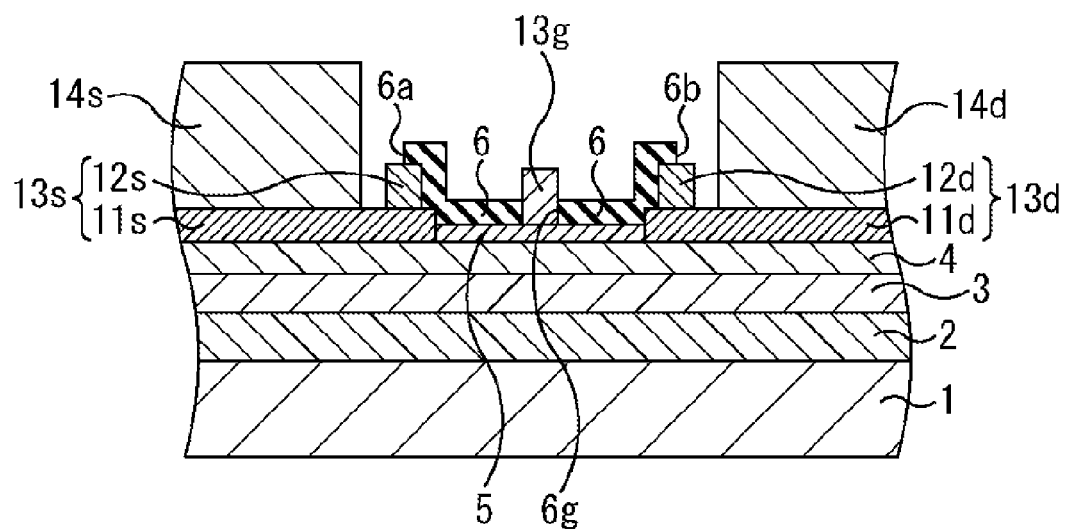

As illustrated in FIG. 10C, a gate electrode 13g is formed in the opening 6g.

Figure 10D:
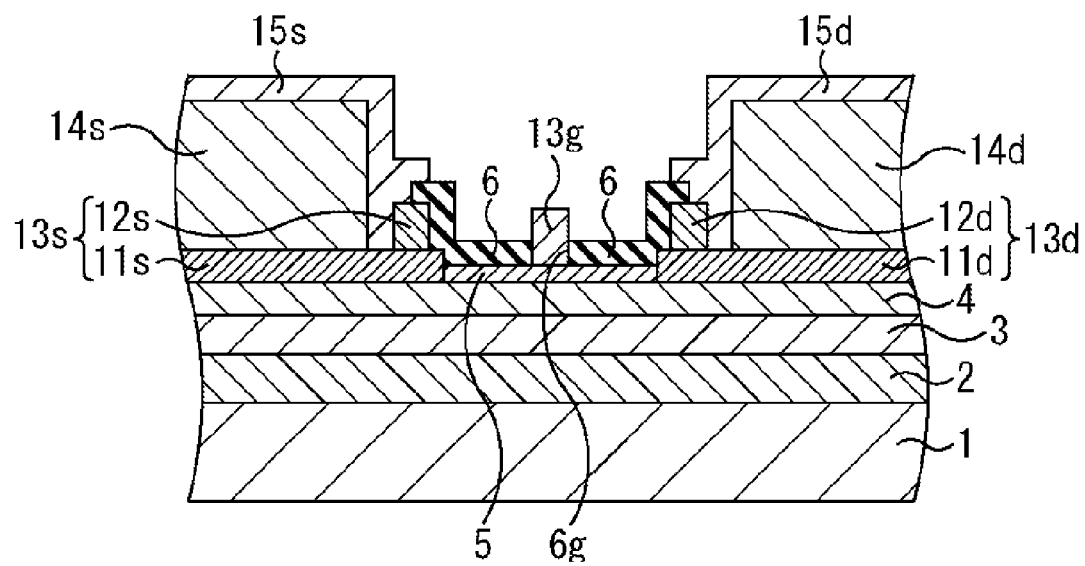

As illustrated in FIG. 10D, a Ta film 15s and a Ta film 15d are formed by a similar manner as the third embodiment.

In this way, the GaN type HEMT may be manufactured.

Fifth Embodiment

Figure 11:
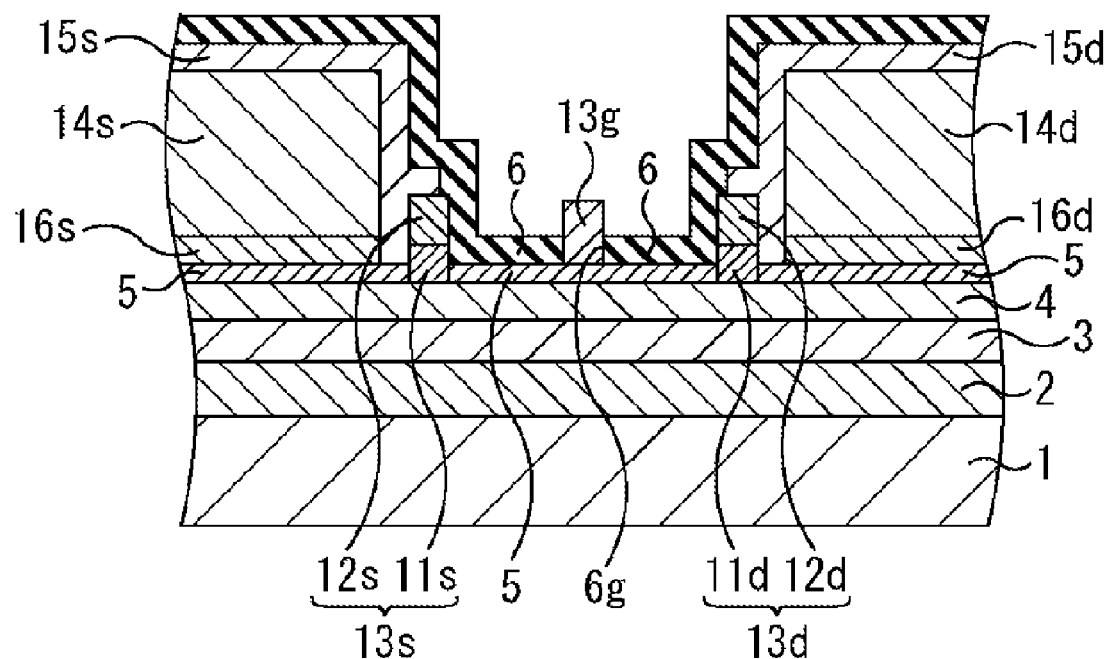
FIG. 11 is a sectional view illustrating a GaN type HEMT structure according to the fifth embodiment.

Now, a fifth embodiment will be described. FIG. 11 is a sectional view illustrating a GaN type HEMT (compound semiconductor device) structure according to the fifth embodiment.

According to the fifth embodiment, a Ta film 11s exists immediately under an Al film 12s, and a Ta film 11d exists immediately under an Al film 12d. Accordingly, an n-GaN layer 5 exists at the lower part of the Au film 14s and the Au film 14d. A Ti film 16s is formed between the Au film 14s and the n-GaN layer 5, and a Ti film 16d is formed between the Au film 14d and the n-GaN layer 5 as an adhesive film. Other configurations are the same as those of the third embodiment.

According to the fifth embodiment, the surface of the Ta film 11s is covered by the Al film 12s and that of the Ta film 11d is covered by the Al film 12d. Thus, a peeling and oxidation that are caused due to stress when annealing is applied to establish ohmic property may be reduced.

Now, a method for manufacturing a GaN type HEMT (compound semiconductor device) according to the fifth embodiment will be described. FIGS. 12A to 12D are sectional views illustrating a method for manufacturing a GaN type HEMT (compound semiconductor device) according to the fifth embodiment.

Figure 12A:
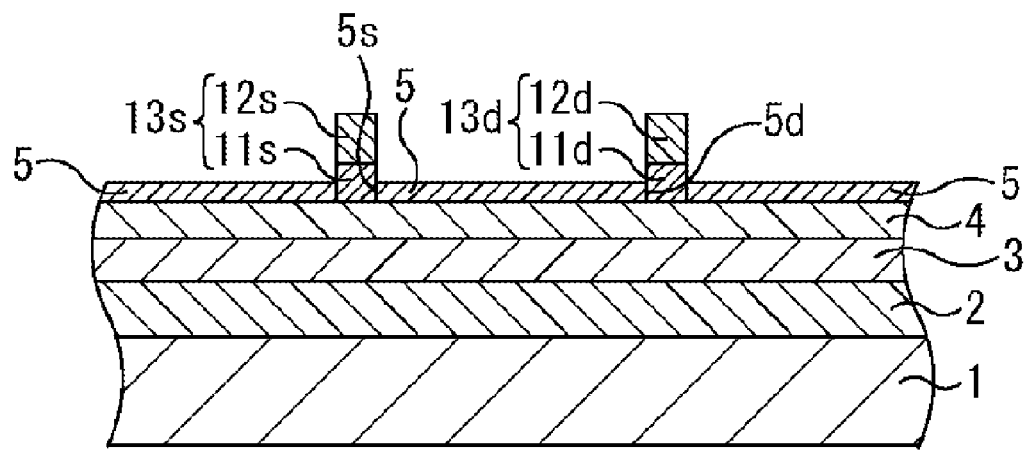
FIGS. 12A to 12D are sectional views illustrating a method for manufacturing a GaN type HEMT according to the fifth embodiment.

According to the fifth embodiment, processes up to forming an n-GaN layer 5 is performed by a similar manner as the first embodiment (refer to FIG. 4A). A resist pattern (not illustrated) is formed to open an area where the Ta film 11s and the Ta film 11d are to be formed. At this time, the area where the Ta film 11s is to be formed is substantially coincided with the area where the Al film 12s is formed according to the first embodiment, the area where the Ta film 11d is to be formed is substantially coincided with the area where the Al film 12d is formed according to the first embodiment. The n-GaN layer 5 is etched using the resist pattern as a mask to form an opening 5s for a source electrode and an opening 5d for a drain electrode as illustrated in FIG. 12A. The Ta film 11s and the Al film 12s are formed in the opening 5s by a lift-off method. The Ta film 11d and the Al film 12d are formed in the opening 5d by a lift-off method. For forming the Ta films 11s and 11d, and the Al films 12s and 12d, Ta and Al are deposited. The Al and Ta deposited on the resist pattern are removed together with the resist pattern. Then, an ohmic property is established by thermal processing in a nitrogen atmosphere 400° C. to 1000° C., for example, at 550° C. In this way, the source electrode 13s and the drain electrode 13d are obtained.

Figure 12B:
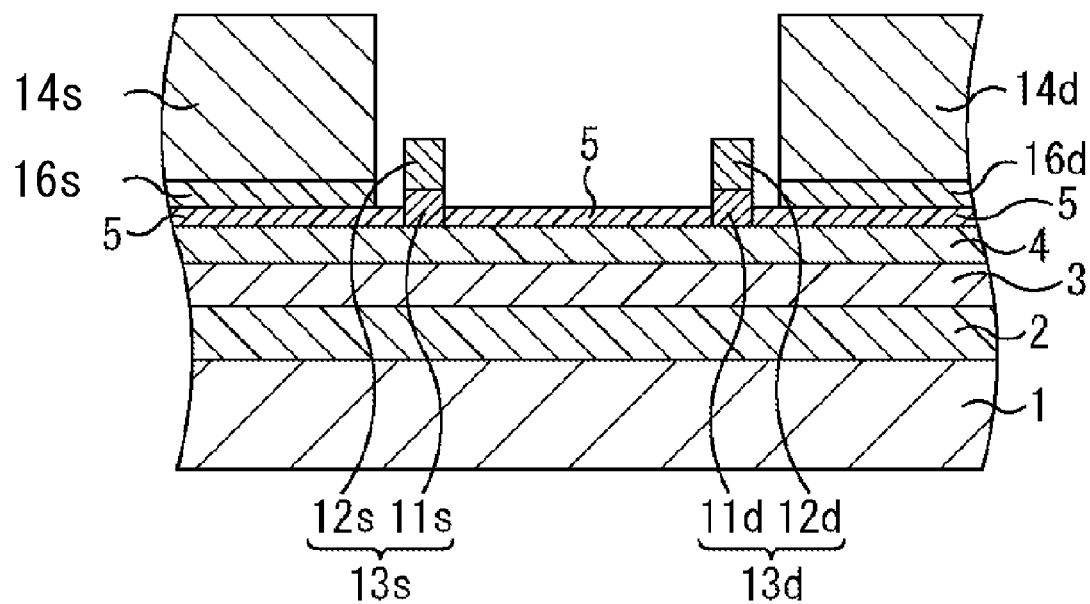

As illustrated in FIG. 12B, a Ti film 16s is formed over an area away from the area where a gate electrode 13g is to be formed and away from the source electrode 13s over the n-GaN layer 5, and a Ti film 16d is formed over an area away from the area where the gate electrode 13g is to be formed and away from the drain electrode 13d over the n-GaN layer 5. The Ti film 16s and the Ti film 16d are formed, for example, by a lift-off method. The Au film 14s is formed over the Ti film 16s, and the Au film 14d is formed over the Ti film 16d by a plating method.

Figure 12C:
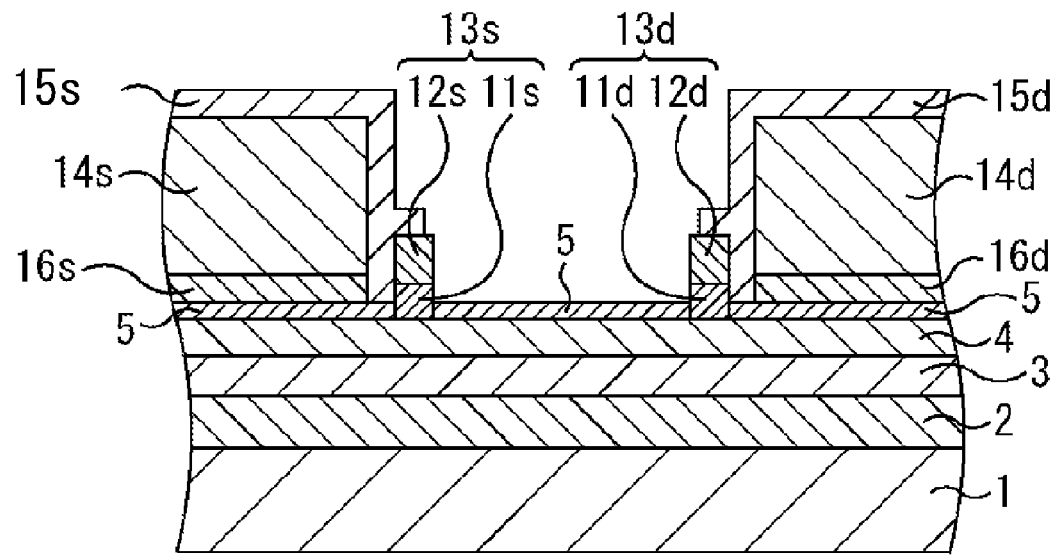

As illustrated in FIG. 12C, a Ta film 15s and a Ta film 15d are formed by a similar manner as the third embodiment.

Figure 12D:
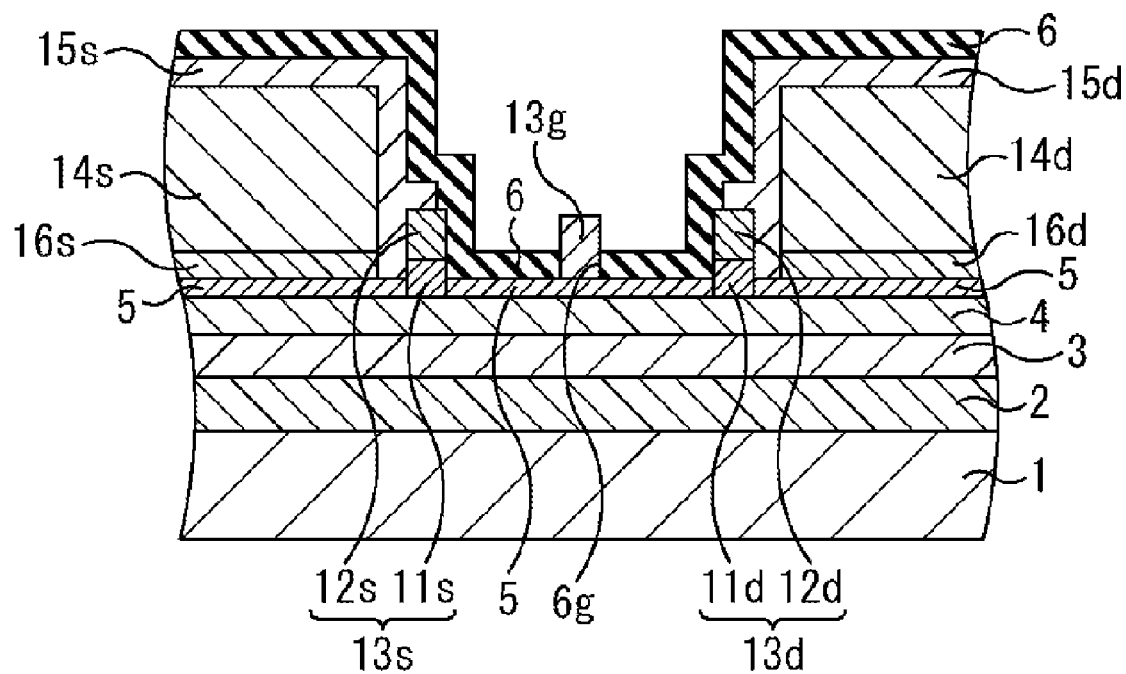

As illustrated in FIG. 12D, a SiN film 6 is formed over the Ta film 15s, the source electrode 13s, the n-GaN layer 5, the drain electrode 13d, and the Ta film 15d. The SiN film 6 is formed, for example, by a plasma CVD method. An opening 6g is formed in the SiN film 6, and the gate electrode 13g is formed in the opening 6g.

In this way, the GaN type HEMT may be manufactured.

In any of the embodiments, a substrate 1 may include, for example, a silicon carbide (SiC) substrate, a sapphire substrate, a silicon substrate, a GaN substrate, or a GaAs substrate. The substrate 1 may be conductive, semi-insulating or insulating.

Structures of the gate electrode 13g, the source electrode 13s, and the drain electrode 13d are not limited to those described in the above embodiments. For example, these elements may be composed of a single layer. Moreover, methods to form these elements are not limited to the lift-off method. Furthermore, thermal processing after formation of the source electrode 13s and the drain electrode 13d may be omitted as long as an ohmic property is achieved. Furthermore, thermal processing may be applied to the gate electrode 13g as well.

A material for conductive films that couple the Au film 14s and the Al film 12s, and the Au film 14d and the Al film 12d is not limited to Ta. However, it is desirable that the electrical resistivity of the material be approximately $6 \times 10^{-7}$ $\Omega \cdot m$ or less to achieve sufficient conductivity. Moreover, it is preferable that the melting point of the material be 1000° C. or more to secure resistance for thermal processing after formation of conductive films and resistance for electromigration when used. Such materials include, Ti, Zr, Hf, V, Re, Nb, Ta, Pt, Pd, Os, Ru, Ni, Gd, Mo, Co, W, Ir, Rh, or Cu. Nitride, silicide, and carbide of these materials (for example, TaN, MoSi, and TiC) may be used as well. In particular, Ti is preferable, because the Ti exhibits high adhesiveness and is easy to form. Moreover, a structure of the conductive film may be a laminate structure. An Al alloy film may be used instead of the Al film, and an Au alloy film may be used instead of the Au film.

Moreover, a portion in which the gate electrode 13g is in contact with the n-GaN layer 5 may be etched. The depth may match the thickness of the n-GaN layer 5, or may be shallower than that. An insulating film may be interposed between the n-GaN layer 5 and the gate electrode 13g. In other words, a metal-insulator-semiconductor (MIS) structure may be employed instead of a Schottky type structure.

Sizes and positions of the Al film 12s, the Al film 12d, the Au film 14s, and the Au film 14d are not limited. However, it is preferable that line edge roughness (LER) and electromigration of these be taken into consideration when setting the sizes and positions.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that various changes, substitutions, and alterations could be made hereto without departing from the spirit and scope of the invention.

What is claimed is:

1. A compound semiconductor device comprising:
    a carrier transit layer formed over a substrate;
    a carrier supply layer formed over the carrier transit layer;
    a first metal film and a second metal film formed over the carrier supply layer;
    a first Al comprising film formed over the first metal film;
    a second Al comprising film formed over the second metal film;
    a first Au comprising film formed over the first metal film and is free of direct contact with the first Al comprising film;
    a second Au comprising film formed over the second metal film and is free of direct contact with the second Al comprising film; and
    a gate electrode that is located over the carrier supply layer between the first metal film and the second metal film.

2. The compound semiconductor device according to claim 1, wherein:
    the first Au comprising film is provided away from the first Al comprising film in a substantially parallel direction to a surface of the substrate; and
    the second Au comprising film is provided away from the second Al comprising film in the substantially parallel direction to the surface of the substrate.

3. The compound semiconductor device according to claim 1, wherein:
    the first Al comprising film is located between the first Au comprising film and the gate electrode, and
    the second Al comprising film is located between the second Au comprising film and the gate electrode.

4. The compound semiconductor device according to claim 1, further comprising:
    a first conductive film that couples the first Al comprising film and the first Au comprising film; and
    a second conductive film that couples the second Al comprising film and the second Au comprising film.

5. The compound semiconductor device according to claim 4, wherein an electrical resistivity of the first conductive film and that of the second conductive film are $6 \times 10^{-7}$ Ω·m or less.

6. The compound semiconductor device according to claim 4, wherein a melting point of the first conductive film and that of the second conductive film are 1000° C. or more.

7. The compound semiconductor device according to claim 4, wherein the first conductive film and the second conductive film are Ta film.

8. The compound semiconductor device according to claim 1, wherein:
    the first Au comprising film is provided on the first metal film; and
    the second Au comprising film is provided on the second metal film.

9. The compound semiconductor device according to claim 1, wherein:
    the first Au comprising film is provided away from the first metal film in the direction substantially parallel to the surface of the substrate; and
    the second Au comprising film is provided away from the second metal film in the direction substantially parallel to the surface of the substrate.

10. The compound semiconductor device according to claim 1, wherein
    the first metal film and the second metal film are in ohmic contact with the carrier supply layer.

11. A compound semiconductor device manufacturing method comprising:
    forming a carrier transit layer over a substrate;
    forming a carrier supply layer over the carrier transit layer;
    forming a first metal film and a second metal film over the carrier supply layer;
    forming a first Al comprising film over the first metal film;
    forming a second Al comprising film over the second metal film;
    forming a first Au comprising film over the first metal film and is free of direct contact with the first Al comprising film;
    forming a second Au comprising film over the second metal film and is direct contact with the second Al comprising film; and
    forming a gate electrode between the first metal film and the second metal film over the carrier supply layer.

12. The compound semiconductor device manufacturing method according to claim 11, wherein:
    the first Au comprising film is formed in an identical plane with the first Al comprising film substantially parallel indirection to the surface of the substrate; and
    the second Au comprising film is formed in an identical plane with the second Al comprising film substantially parallel in direction to the surface of the substrate.

13. The compound semiconductor device manufacturing method according to claim 11, wherein;
    the first Al comprising film is located between the first Au comprising film and the gate electrode, and
    the second Al comprising film is located between the second Au comprising film and the gate electrode.

14. The compound semiconductor device manufacturing method according to claim 11 further comprising:
    forming a first conductive film that couples the first Al comprising film and the first Au comprising film; and
    forming a second conductive film that couples the second Al comprising film and the second Au comprising film.

15. The compound semiconductor device manufacturing method according to claim 14, wherein an electrical resistivity of the first conductive film and the second conductive film are $6 \times 10^{-7}$ Ω·m or less.

16. The compound semiconductor device according to claim 14, wherein a melting point of the first conductive film and that of the second conductive film are 1000° C. or more.

17. The compound semiconductor device according to claim 14, wherein the first conductive film and the second conductive film are Ta film.

18. The compound semiconductor device according to claim 11, wherein:
the first Au comprising film is formed on the first metal film; and
the second Au comprising film is formed on the second metal film.

19. The compound semiconductor device according to claim 11, wherein:
the first Au comprising film is formed away from the first metal film in the substantially parallel direction to the surface of the substrate; and
the second Au comprising film is formed away from the second metal film in the substantially parallel direction to the surface of the substrate.

20. The compound semiconductor device according to claim 11, wherein
the first metal film and the second metal film are in ohmic contact with the carrier supply layer.

* * * * *